United States Patent
Anderson et al.

(10) Patent No.: US 7,723,162 B2
(45) Date of Patent: May 25, 2010

(54) METHOD FOR PRODUCING SHOCK AND TAMPER RESISTANT MICROELECTRONIC DEVICES

(75) Inventors: Curtis W. Anderson, Mesa, AZ (US); James A. Sangiorgi, Phoenix, AZ (US)

(73) Assignee: White Electronic Designs Corporation, Phoenix, AZ (US)

( * ) Notice: Subject to any disclaimer, the term of this patent is extended or adjusted under 35 U.S.C. 154(b) by 144 days.

(21) Appl. No.: 11/942,572

(22) Filed: Nov. 19, 2007

(65) Prior Publication Data
US 2009/0047797 A1 Feb. 19, 2009

Related U.S. Application Data

(63) Continuation of application No. 10/104,598, filed on Mar. 22, 2002, now abandoned.

(51) Int. Cl.
*H01L 21/44* (2006.01)
(52) U.S. Cl. .................. 438/123; 438/106; 438/127; 438/124; 438/126; 257/E21.499
(58) Field of Classification Search ......... 438/106–127; 257/E21.499
See application file for complete search history.

(56) References Cited

U.S. PATENT DOCUMENTS

| | | | |
|---|---|---|---|
| 4,477,828 A | 10/1984 | Scherer | |
| 4,559,272 A * | 12/1985 | Oldham | 428/418 |
| 5,258,334 A | 11/1993 | Lantz, II | |
| 5,399,441 A | 3/1995 | Bearinger et al. | |
| 5,611,884 A | 3/1997 | Bearinger et al. | |
| 5,711,987 A | 1/1998 | Bearinger et al. | |
| 5,762,711 A | 6/1998 | Heffner et al. | |
| 5,807,611 A | 9/1998 | Bearinger et al. | |
| 5,877,093 A | 3/1999 | Heffner et al. | |
| 6,072,580 A | 6/2000 | Barnes et al. | |
| 6,110,537 A * | 8/2000 | Heffner et al. | 427/448 |
| 6,144,106 A | 11/2000 | Bearinger et al. | |
| 6,319,740 B1 | 11/2001 | Heffner et al. | |
| 6,541,874 B2 | 4/2003 | Nguyen et al. | |
| 6,628,526 B1 | 9/2003 | Oshima et al. | |
| 6,692,611 B2 | 2/2004 | Oxman et al. | |
| 6,963,125 B2 | 11/2005 | Featherby et al. | |
| 2003/0013235 A1 * | 1/2003 | Featherby et al. | 438/127 |

* cited by examiner

*Primary Examiner*—Thanh Nguyen
(74) *Attorney, Agent, or Firm*—Allen J. Moss; Alex Starkovich; Squire, Sanders & Demspey L.L.P.

(57) ABSTRACT

A method of producing a microelectronic device resistant to tampering, inspection and damage from surrounding environment or operating conditions includes: (i) applying an adhesion layer on a circuit including a die fixed and electrically connected to a laminate substrate; (ii) spraying, through a flame spray process, a tamper resistant coating over the applied adhesion layer; (iii) applying a first encapsulant for filling spaces and air pockets; (iv) removing air and gases from the first encapsulant; and (v) applying a second encapsulant around the first encapsulant for providing a moisture barrier 42 and handling surfaces for the microelectronic device.

18 Claims, 7 Drawing Sheets

(SIDE VIEW)

Fig. 1a
*(TOP VIEW)*

Fig. 1b
*(SIDE VIEW)*

Fig. 2a
(TOP VIEW)

Fig. 2b
(SIDE VIEW)

Fig. 3

Fig. 4a
*(TOP VIEW)*

Fig. 4b
*(SIDE VIEW)*

Fig. 5

Fig. 6a
*(TOP VIEW)*

Fig. 6b
*(SIDE VIEW)*

METHOD FOR PRODUCING SHOCK AND TAMPER RESISTANT MICROELECTRONIC DEVICES

RELATED APPLICATIONS

This application is a continuation of and claims priority to U.S. application Ser. No. 10/104,598 filed Mar. 22, 2002, now abandoned the disclosure of which is incorporated herein by reference in its entirety for all purposes.

BACKGROUND

1. Field of the Invention

The present invention relates to methods for producing microelectronic devices that are protected from physical damage induced by external conditions. In particular, the invention relates, but not exclusively, to semiconductor devices having (i) a tamper resistant coating (TRC) to protect the device from physical or electromagnetic inspection and (ii) an encapsulation package to protect the device from physical damage induced by extreme operating conditions and/or the surrounding environment.

2. Related Art

Tamper resistant coatings (TRCs) are well known in the art for providing a physical barrier to prevent inspection of, and tampering with, the underlying circuitry and contents of electronic components.

For example, protective coating processes using application of liquids, are described in U.S. Pat. No. 5,399,441 to Bearinger et al. and U.S. Pat. No. 5,258,334 to Lantz. Such liquid application processes, however, tended to be disadvantageous in that they typically involved (a) processing temperatures that could be detrimental to delicate circuitry, and (b) applying coatings before circuit connections are made, thus tending to make the resulting device less tamper resistant.

Processes and systems for coating electronic circuits with protective coatings and security coatings using a thermal spray are also generally known. Examples of such processes are described in U.S. Pat. Nos. 5,877,093; 6,110,537; 5,762,711; and 6,319,740 all to Heffner et al. and fully incorporated herein by reference. As compared to processes involving liquid application, such thermal spray processes typically use temperatures less likely to be detrimental to delicate circuitry and provide a better coverage of coating at lower cost. Also, the thermal spray coatings are typically applied after circuit connections are made, thus improving the tamper resistant properties of the resulting device.

However, applying protective coatings or tamper resistant coatings using a spray, sputter, deposition or other floating particle application process are susceptible to, for example: (i) leaving uncoated areas underneath certain surfaces of the device; and/or (ii) leaving pockets of air in or under the coatings of the device when the device is subsequently encapsulated or coated with an encapsulation material. Uncoated areas and/or air pockets may occur at the same locations on devices coated with a sprayed particle process, most notably, under or around wire bonds establishing electrical connection to semiconductor device. An example of uncoated areas that may result from coatings applied using a spray process is discussed in greater detail below in reference to FIGS. 2A and 2B.

The patents to Heffner et al. disclose coatings applied by thermal spray process to circuits in a ceramic package. Air gaps and exposed (uncoated) areas in devices with ceramic packages are typically not as problematic since ceramic packages are typically sealed on all sides and since little force or pressure is ever applied on circuit areas such as the bond wires. However, devices enclosed in ceramic packages may not be suitable for high acceleration and/or shock applications since the ceramic packages have a tendency to fracture or break under stress or impact. Consequently, it is preferable to use a laminate substrate for a shock resistant microelectronic circuit. In addition, laminate substrates are less expensive and are easier to fabricate than their ceramic counterparts and thus are better suited for high acceleration and/or shock applications.

However, the uncoated areas and/or air pockets that may result from application of protective and security coatings may be more problematic in a laminate substrate device than in ceramic packages. Where some of the device surfaces remain uncoated, the device may be susceptible to corrosion resulting from moisture, ionic content and voltage present at the exposed areas. In addition, gaps present under surfaces of the coated device (e.g., under wire bonds) may pose additional problems in that; physical stresses and forces encountered by the coated device can sometimes cause electrical connections to severe or come loose near gap.

In an attempt to reduce exposed areas after a thermal spray process, an encapsulation layer may be applied to the device. However, during this process, air pockets may be left in the circuit package. Air pockets can be detrimental because leakage of some air during a cure process of the encapsulation layer tends to form void defects in the package and lead to device failures from, for example, humidity exposure, etc. Additionally, entrapped air may increase internal stress during temperature cycles and thus lead to higher failure rates.

Consequently, there is a need for a low cost, reliable, microelectronic device having improved tamper-resistant characteristics and a high tolerance to shock and vibration, and method for making the same.

SUMMARY OF THE INVENTION

In accordance with one aspect of the present invention one or more of the foregoing problems are solved by providing a microelectronic device including: a substrate; a circuit disposed on the substrate; a first coating disposed over the circuit acting as an adhesion layer; a second coating disposed over the first coating by a thermal spray process for protecting security of the circuit and its contents; and a third coating surrounding the circuit and first and second coatings, for providing a moisture barrier and/or a handling layer for the microelectronic device.

According to another aspect of the invention, a shock and tamper resistant microelectronic device is made by the process of: (i) applying an adhesion layer over a die attached to a substrate; (ii) applying a tamper resistant coating, via a thermal spray process, over the adhesion layer; and (iii) applying a moisture-resistant coating over the tamper resistant coating; and (iv) inducing the moisture-resistant coating into air-gaps of the device.

In another aspect of the invention a method for manufacturing a microelectronic circuit includes: (i) applying one or more coatings over a die attached to a substrate, the coating(s) for preventing inspection and/or tampering with the circuit; (ii) inducing a filler material into gaps of the coated circuit; and (iii) coating the circuit with a moisture-barrier and handling material.

In yet another aspect of the invention a shock resistant microelectronic device is disclosed including: a substrate, circuit disposed on the substrate; a first coating disposed on the circuit acting as an adhesion layer; a second coating disposed on the first coating for protecting security of the circuit and its contents; a filler material for filling gaps in the coated circuit; and a third coating for providing a moisture barrier and/or handling surface for the device.

BRIEF DESCRIPTION OF THE DRAWINGS

Additional aspects, features and advantages of the present invention will become more apparent from the following detailed description in reference to the appended drawing in which like reference numerals denote like elements and in which.

DETAILED DESCRIPTION OF THE PREFERRED EMBODIMENTS

Figure 1A:
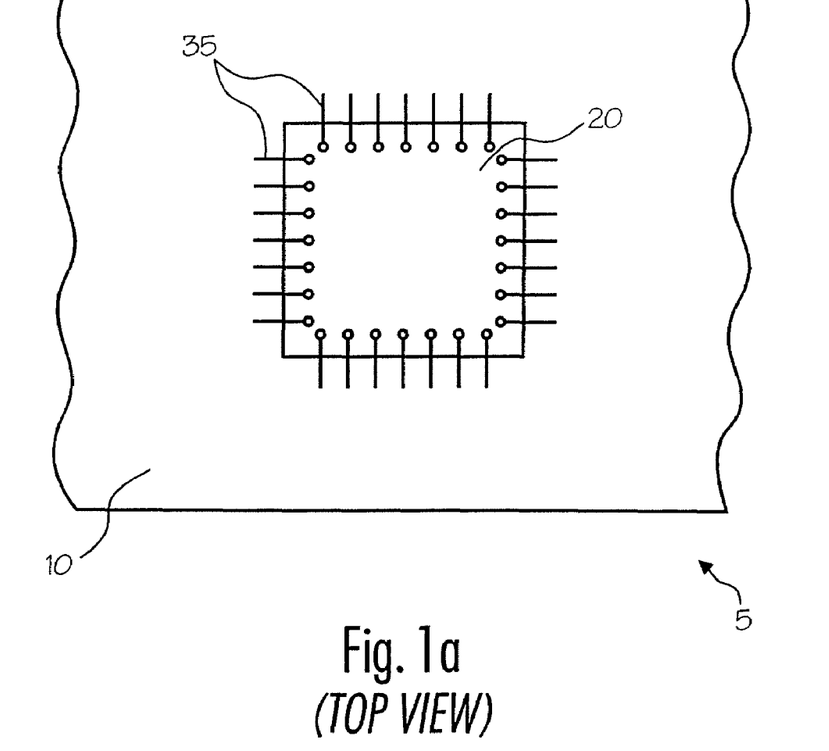
FIGS. 1A and 1B illustrate top and cross-sectional side views respectively of a semiconductor die and substrate.
Figure 1B:
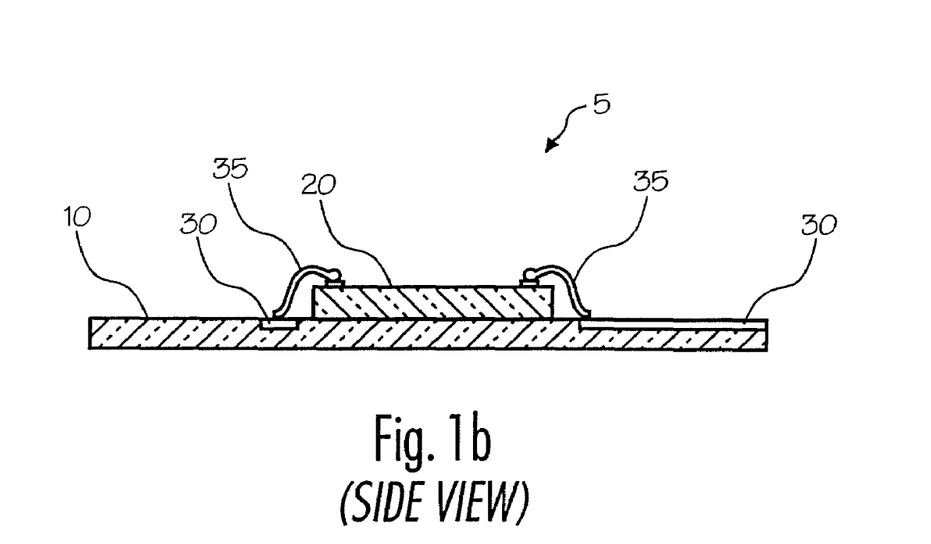

Referring to FIGS. 1A and 1B a microelectronic circuit 5 suitable for coating, such as an integrated circuit or multi-chip module may include: a substrate 10, a circuit die (or package of circuit dies) 20, and electrical connectors 35. Circuit die 20 is mounted and electrically interconnected to substrate 10. As shown in FIG. 1B, substrate 10 may include conductive contacts 30 for facilitating electrical connections to die 20 via electrical connectors 35.

Die 20 may be any type of chip, integrated circuit, memory, or any combination thereof that is desired to be attached to substrate 10. Die 20 may also represent more than one die in a package. Substrate 10 is any material suitable for mounting a circuit die 20 thereon and is preferably an interconnecting laminate substrate. Electrical connectors 35 may be any type of conduit or arrangement for conducting electricity or grounding between die 20 and substrate 10. In one embodiment, electrical connectors 35 are gold wire bonded between die 20 and contacts 30 on substrate 10. Die 20 may be fixed to substrate 10 by any suitable method such as soldering or using an adhesive (not shown).

Figure 2A:
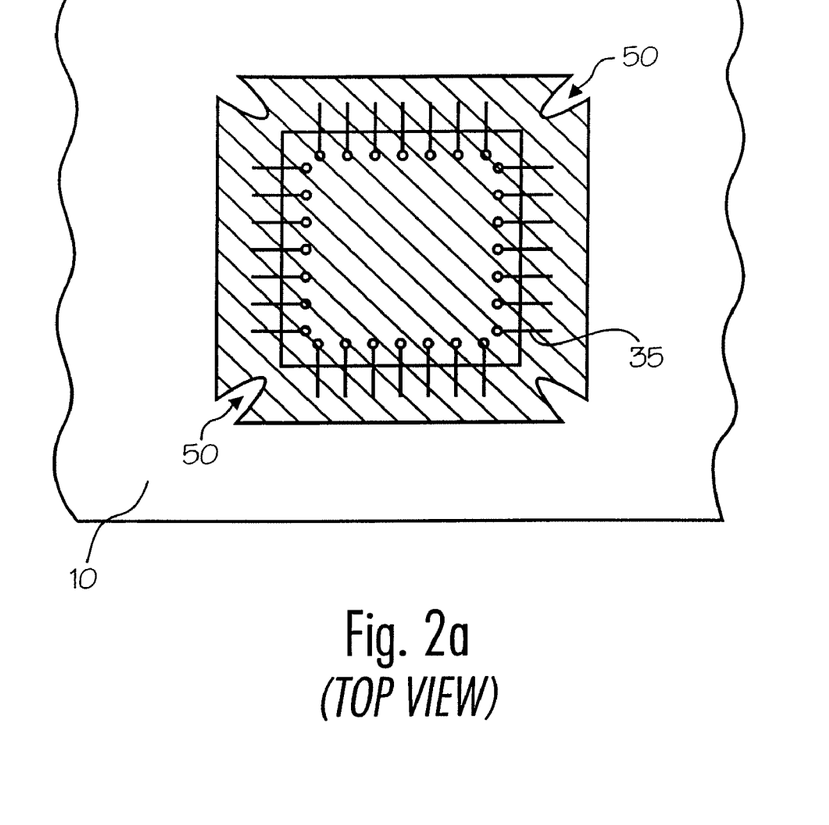
FIGS. 2a and 2b illustrate top and cross-sectional side views respectively, of the semiconductor die and substrate after protective coatings have been applied.
Figure 2B:
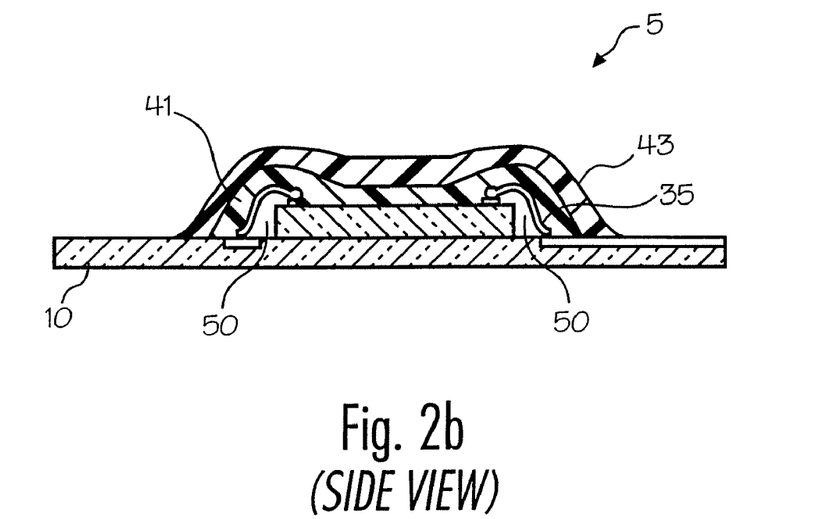
Figure 3:
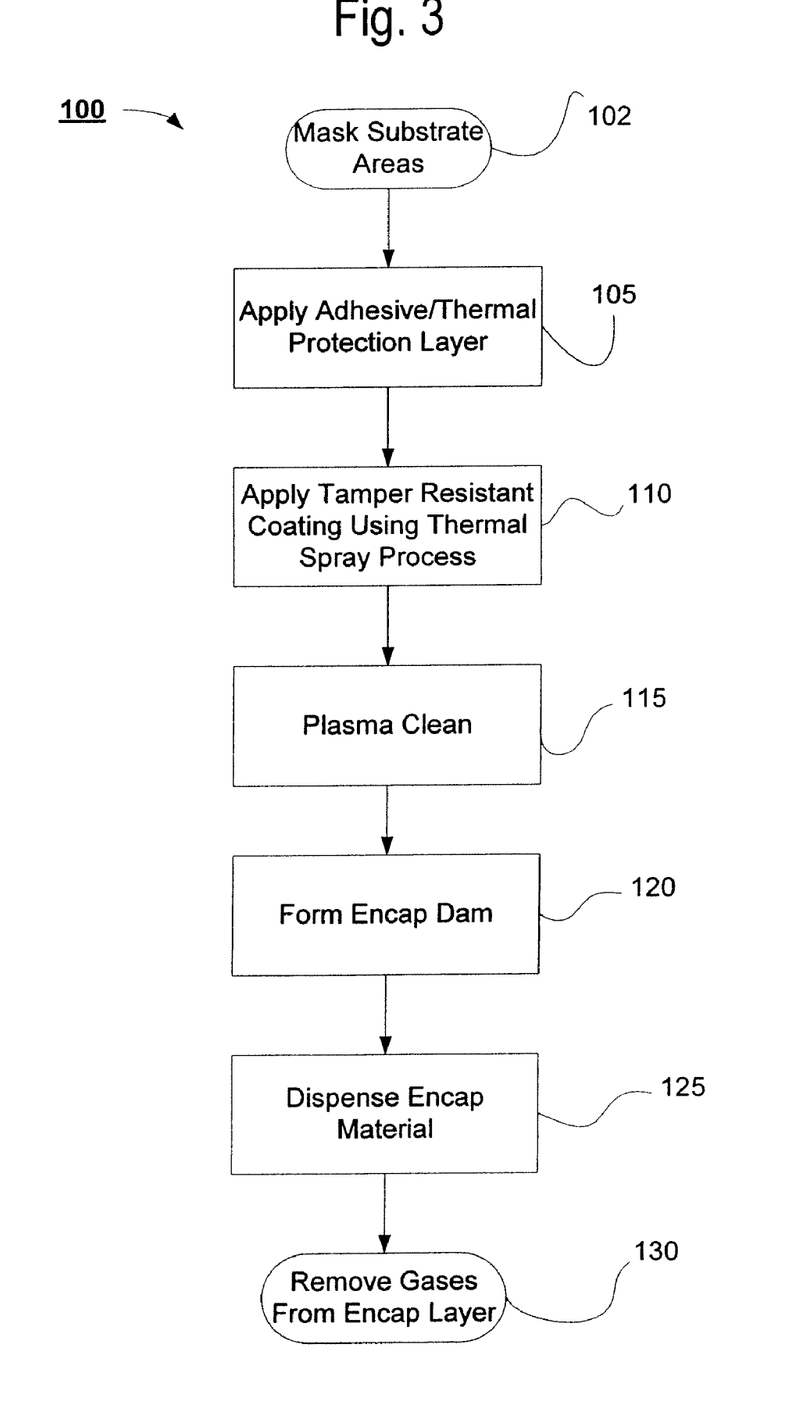
FIG. 3 is a flow chart illustrating a method of producing a shock and tamper resistant microelectronic device according to a first embodiment of the invention.

Referring now to FIGS. 2A, 2B, 3, and 4 microelectronic circuit 5 is made shock and tamper resistant by a process 100 (FIG. 3) comprising, in general, the steps of: masking areas of substrate 10 outside of the relevant area (FIG. 3, step 102), if appropriate; applying one or more adhesive/thermal protection layers 41 (also referred to herein variously as an intermediate layer and primer coating) over die 20, electrical connectors 35, contacts 30 and the surrounding portions of substrate 10 (FIG. 3, step 105); applying, preferably using a thermal spray process as described in the Heffner et al. patents, a tamper-resistant coating (TRC) 43, e.g., ceramic, over primer coating 41 (FIG. 3, step 110); if desired, cleaning the TRC coated circuit to dispose of any contaminants (FIG. 3, step 115); optionally, forming a barrier around the perimeter of the TRC coated circuit (FIG. 3, step 120); dispensing an encapsulant material 45 (FIG. 4) inside the perimeter of the barrier if present, or around the TRC coated circuit, for example using an injection mold (FIG. 3, step 125); and inducing the encapsulant material into gaps of the coated device (FIG. 3, step 130). Each step in process 100 will hereinafter be more fully described.

Referring to FIGS. 2A and 2B, coatings 41 and 43, when applied in steps 105 and 110, overlay electrical connectors 35, e.g., wire bonding, tending to leave uncoated areas or gaps 50 in areas near and under electrical connectors 35 and/or near corners of die 20 where wire bonds 35 may not be present. Gaps 50 are problematic for the reasons discussed above. Consequently, in one method for producing a shock and tamper resistant microelectronic device, an encapsulant 45 is applied to circuit 5, and degassed (steps 125, 130) to provide a moisture resistant barrier and fill gaps 50.

The method of FIG. 3. may include the steps (not shown) of fixing and wire bonding die 20 to substrate 10 as an integral part thereof, or may be initiated upon a circuit 5 including the die, substrate and established electrical connections, such as that shown in FIGS. 1A and 1B, produced through a separate process.

Masking 102 may be effected in preparation for applying protective coatings; masking in areas in which protective coatings are not desired, typically substrate areas immediately surrounding a perimeter defined by the die and wire bonds. Any process for masking a circuit consistent with the particular coating materials may be used. In a preferred embodiment a metal mask is used to block coatings from being applied to undesired areas, for example the outside perimeter or seal ring area of the package. Masking might not be necessary or desired if the entire substrate on which the die is mounted, is to be coated. It also should be recognized that masking might be performed prior to fixing and wire bonding the die to the substrate.

After masking, if desired, an intermediate layer (primer coating) 41 is preferably then applied to circuit 5 105. Intermediate layer 41 may serve as an adhesion layer for promoting adhesion of tamper-resistant coating 43 to circuit 5 components (e.g., substrate 10, die 20 and wire bonds 35). Intermediate layer 41 may also serve as an insulation layer to protect circuit 5 components (20, 35) from being damaged by molten particles during the application of tamper-resistant coating 43 in a thermal spray process (step 110). Intermediate layer 41 may consist of any suitable material for providing the adhesion and/or insulation properties discussed above.

In a preferred embodiment, intermediate layer 41 is one or more layers of primer coating having a composition such as Parylene polymer, a solid thermoplastic, a solid Soloxane or thermoset based liquid polymer. Any process for uniformly distributing liquid coatings may be used to apply intermediate layer 41. Some examples of intermediate layer application include, reactive vacuum deposition, liquid drop or spray deposition or submerging circuit 5 in a primer bath. In a preferred embodiment, two coats of primer coating are applied using a liquid spray process to result in a primer coating having a range of 0.1 to 1 mils in thickness. Circuit 5 then may or may not be subjected to a raised temperature curing process for hardening, depending on the type of materials used for intermediate layer 41.

After intermediate layer 41 is established, tamper-resistant coating (TRC) 43 is then applied over the primer coating, preferably, although not necessarily, using a thermal spray process (Step 110). TRC 43 is preferably applied using a flame spray process and/or equipment similar to that discussed in the incorporated patents to Heffner et al. In particular, TRC 43 preferably comprises an opaque, and most preferably electromagnetic-opaque, ceramic material, applied by spraying molten ceramic particles on the primer-coated circuit to achieve a desired TRC thickness. In one embodiment TRC 43 is applied to achieve a TRC thickness in the range of 15-20 thousandths of an inch. TRC 43 forms a shell over the top of the primer-coated circuit including the wire bonds similar to the examples shown in FIGS. 2A and 2B.

Once TRC 43 cures through cooling, the TRC coated circuit 5 may then be cleaned to dispose of any contaminants 115 (Step 115). Cleaning may be performed in any manner. In a preferred embodiment, TRC coated circuit 5 is cleaned using a plasma cleaning process in which any light organic films, oxide layers, particles and residues are removed by flowing ionized gas over circuit 5 (bearing TRC layer 43) in a partial vacuum. Cleaning TRC 43 coated circuit is optional but preferable.

Figure 4A:
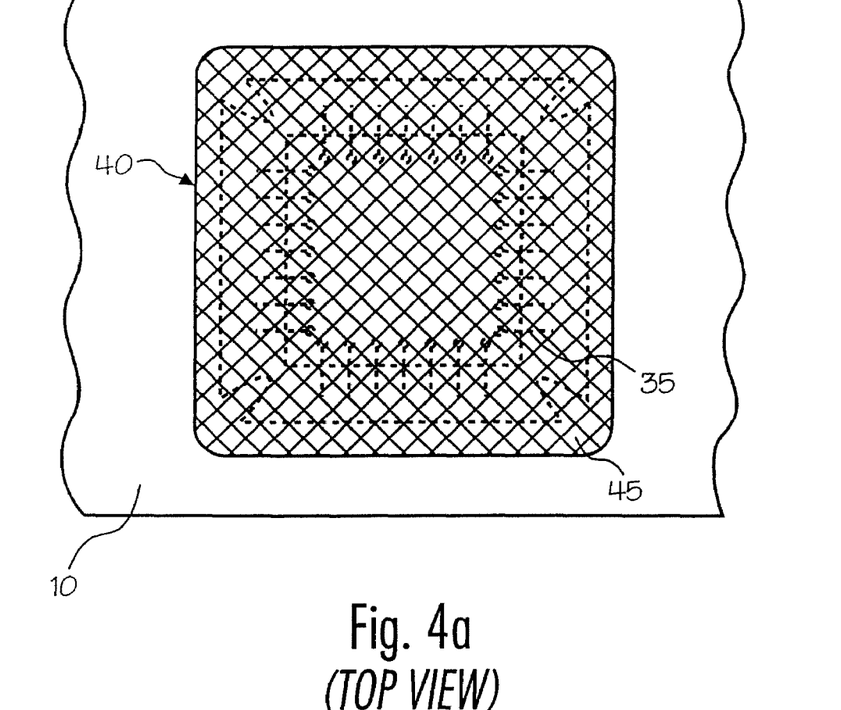
FIGS. 4a and 4b illustrate a shock and tamper resistant microelectronic device produced by the method shown in FIG. 3.
Figure 4B:
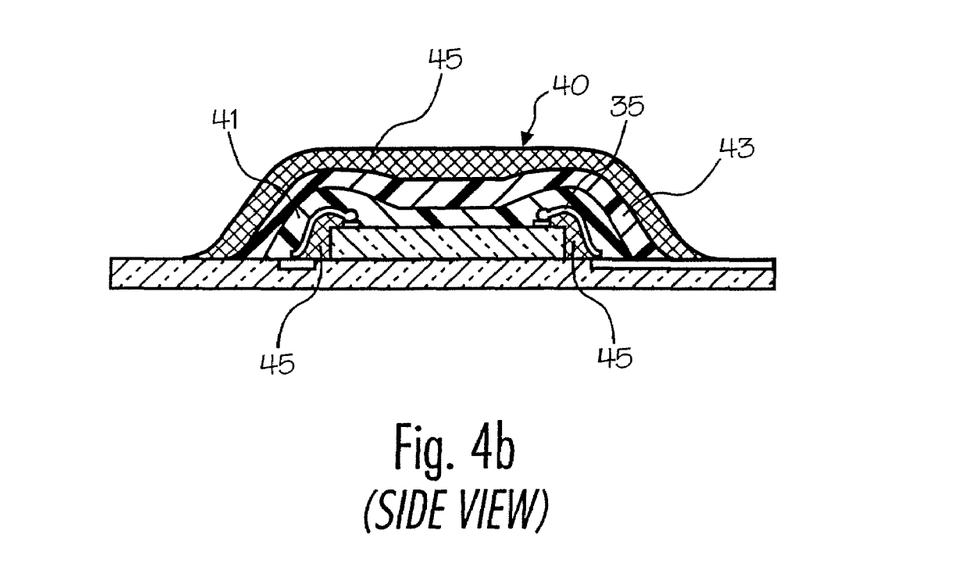

Referring to FIGS. 3, 4A and 4B, a barrier (not shown) may be formed around the perimeter of TRC 43 coated circuit for bare chip encapsulation of circuit 5 (Step 120). The barrier may be formed in any manner suitable for bare chip encapsulation at any point during process 100. In one embodiment of the invention, the barrier is formed using a damming material to prevent spreading of applied liquid encapsulants and to define a shape of the encapsulated circuit. The barrier may ultimately form part of finished circuit 5 or may be stripped from circuit 5 after the liquid encapsulant cures. A liquid epoxy damming material having low viscosity and high thixotropy characteristics may be used as the damming material. The damming material may be dispensed using a medium to high viscosity single fluid and paste pump, for example, a rotary auger pump. The height of the barrier is commensurate with, and preferably taller than, the height of the die mounted on the substrate. In one example of the present invention, the barrier is formed by sequentially dispensing four vertically stacked layers of damming material around the perimeter of TRC 43 coated circuit and curing the damming material. The damming material may be gel cured or snap cured to prevent collapsing and/or sliding of the dam during encapsulation. Curing may be performed by, for example, placing circuit 5 with damming material in a moving air oven. The time and temperature for curing may depend significantly on the type of damming material chosen.

Referring to FIGS. 3, 4A and 4B, encapsulant material 45 for providing moisture protection and handling surface is dispensed inside the perimeter of the barrier and fills the spaces surrounding circuit 5 (Step 125). As shown in this example, encapsulant material 45 entirely surrounds TRC 43, including spaces under electrical connectors 35. In one preferred embodiment, a liquid encapsulant 45 is selected that has as low a viscosity as possible while maintaining good handling characteristics after being cured. A low viscosity encapsulant material is preferred to enable the liquid encapsulant material to penetrate areas and gaps in and under tamper-resistant coating 43. However, an encapsulant having too low of viscosity may not provide sufficient handling properties since it may not cure hard enough to provide sufficient protection against abrasions and extreme conditions. Accordingly, a material used in one preferred embodiment is a self-leveling liquid epoxy encapsulant having a glass transition temperature ($T_g$) of approximately 150° C. Encapsulants having these characteristics possess relatively low viscosities while maintaining reasonable handling properties. Dispensing encapsulant material 45 may be performed in any manner suitable for filling the barrier with a liquid. In one embodiment, a dispensing mechanism is chosen to dispense encapsulates at relatively high flow rates and accurate volume repeatability. The amount of material dispensed may be selected to completely cover TRC 43 coated circuit.

In order to ensure that the liquid encapsulant reaches or fills gaps in TRC 43 coated circuit, the air is removed from encapsulant material 45 (Step 130). The air can be removed either concurrently with or subsequent to dispensing encapsulant 45. Air or other gas pockets may be removed in any manner suitable for removing gaseous substances from liquid materials. Removal of air may be performed by, for example, injecting the liquid encapsulant into the area defined by barrier 42 under pressure to displace air pockets or by vacuuming air from encapsulant material 45. In one embodiment, encapsulant material 45 is dispensed into the area defined by the barrier while inside a vacuum chamber. In another embodiment, air is removed using a vacuum baking process after encapsulant material 45 has been dispensed.

As seen in FIGS. 4A and 4B, through the aforementioned process, primer layer 41, tamper-resistant coating 43 and an encapsulation layer 45 combine to form a protective coating generally indicated as 40. Protective coating 40 facilitates a microelectronic device that is resistant to shocks, vibrations, tampering and inspection.

In an alternate method for producing a shock and tamper resistant microelectronic device, at least two encapsulant layers are used: (i) an inner coating 44 (referred to as "filler material" 44) having a low viscosity to saturate and fill spaces around TRC 43 coated circuit; and (ii) an outer coating 45 (referred to as "shell coating" 45), having a higher viscosity than the inner coating, for providing a moisture barrier 42 and handling surfaces of the microelectronic device. In this embodiment two different types of materials are used for coating the TRC coated circuit; the filler material 44 having a low viscosity and wicking property to reach and fill gaps in the TRC coated circuit and the shell coating 45 to provide a moisture barrier with resilient handling characteristics.

Referring to FIGS. 5, 6A, 6B, and 7a-7j, a second embodiment 200 of a method for forming a shock and tamper resistant microelectronic device is similar to method 100 (previously discussed with reference to FIG. 3) except that, once TRC 43 coated circuit has been cleaned (Step 115), if desired, and a barrier 42 (FIG. 7e-7h) is formed around the perimeter of circuit 5 (Step 120), a filler material 44 is: applied to partially fill the area defined by the barrier (42 FIGS. 7e-7h) and surrounding the TRC coated circuit; degassed (Step 230); and cured (Step 235).

Figure 5:
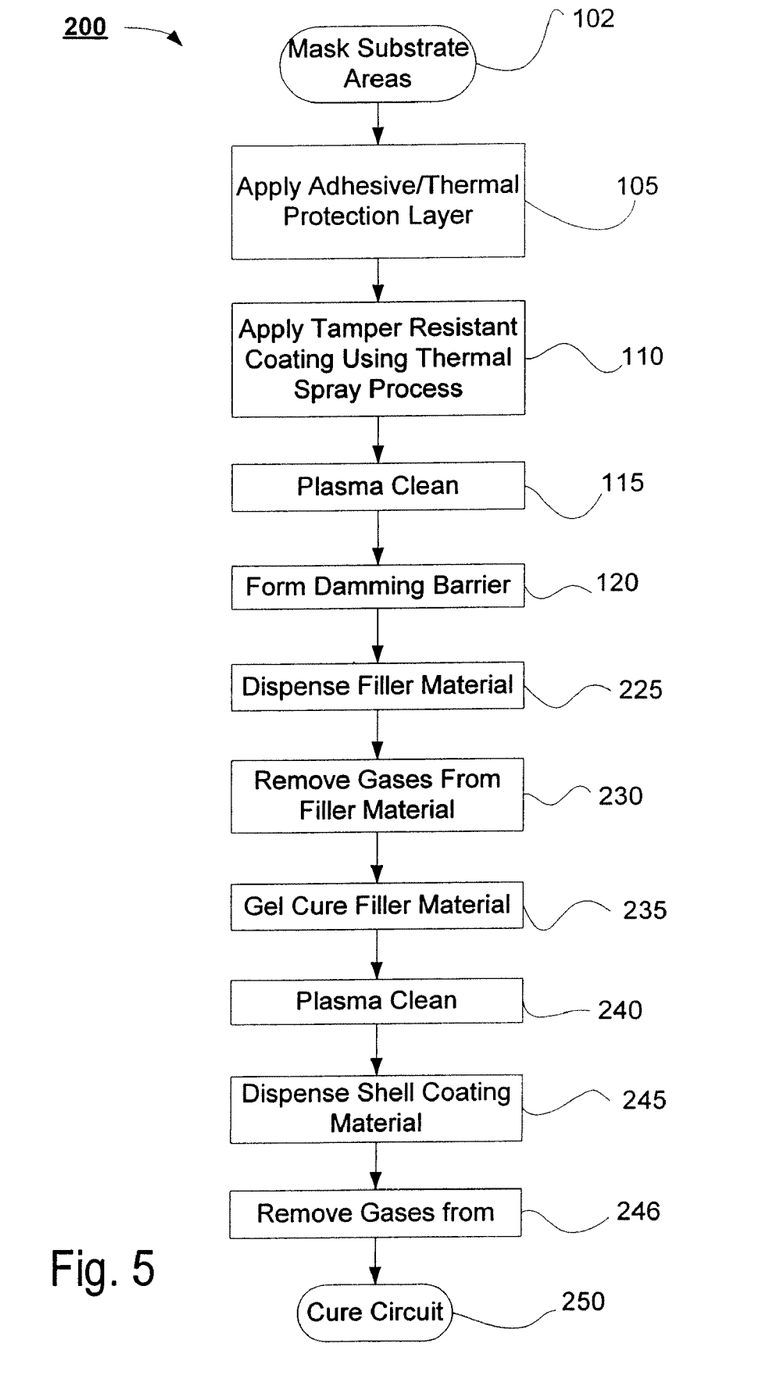
FIG. 5 is a flow chart illustrating a method of producing a shock and tamper resistant microelectronic device according to a second embodiment of the invention.

Filler material 44 is preferably a very low viscosity, low stress epoxy material that: (i) flows easily and wicks up to fill gaps or spaces; and (ii) adheres to integrated circuit passivation materials. Any material having the foregoing characteristics may be used as filler material 44. In a preferred embodiment, an encapsulant used commonly for flip chip applications is used for filler material.

More specifically, Step 225 is suitably effected, i.e. filler material 44 dispensed over the die and bond wires so the wire bond areas are preferably coated to approximately the height of die 20. Step 230 may be effective in a similar manner as Step 130 in method 100, i.e., air or other gases are removed from filler material 44, concurrently with dispensing filler material 44, e.g., dispensing in a vacuum chamber or injecting under pressure, or subsequent to dispensing filler material 44, or a combination of both. In one embodiment air is removed from dispensed filler 44 material by subsequently baking circuit 5 for approximately forty-five minutes at 90° C. under a pressure of approximately twenty-four in. Hg. in a vacuum oven. The vacuum bake process extracts air and other gases residing in the coated circuit.

Filler material 44 may then be cured 235, for example, by placing circuit 5 in a moving air oven at 110° C. for thirty minutes (Step 235). Next, it is optional but preferable to clean circuit 5 to increase adhesion of the next applied material and to assure a homogeneous flow of the next applied material 240. Cleaning may be performed as described above using a plasma cleaning process.

Method 200 continues by applying shell coating 45a to coat circuit 5 overlying filler material 44 (Step 245). Shell coating 45a provides a moisture protection and handling surface for the microelectronic device and may comprise any material for performing these functions. In one embodiment, the shell coating material is an epoxy encapsulant having a higher viscosity than filler material 44 to result in a more rigid outer surface than could be achieved with filler material 44 alone. Because filler material 44 resides in the gaps and/or air pockets previously located in TRC 43 coated circuit, the shell coating 45 does not require as low a viscosity to fill these gaps and spaces. However, it is preferable that the shell coating encapsulant still has a viscosity low enough for self-leveling. The shell coating, when hardened, provides a smooth, rigid, moisture resistant and durable handling surface for the microelectronic device. Shell coating 45a may be dispensed using the methods and devices previously discussed. Shell coating 45a may also have air removed using techniques previously discussed (Step 246).

The microelectronic device including substrate, die, wire bonding, primer coating, TRC, filler material and shell coating is then preferably cured by placing the device in a raised temperature environment for a length of time (Step 250). In one example embodiment, curing was performed by placing the microelectronic device in moving air oven for the following cycle: 125° C. for one hour and at 165° C. for ninety minutes.

A microelectronic device made by the foregoing processes yields a device resistant to: tampering, inspection (visual and electromagnetic), moisture, vibration, shocks and other environmental hazards. Since higher viscosity encapsulants generally facilitate increased rigidity once cured, as compared to lower viscosity materials such as filler material 44, the result is a microelectronic device with a protective coating 40 having fewer or no gaps or air pockets (facilitated by filler material 44) and an outer surface highly resistant to impact and adverse conditions (facilitated by shell coating material 45).

Figure 6A:
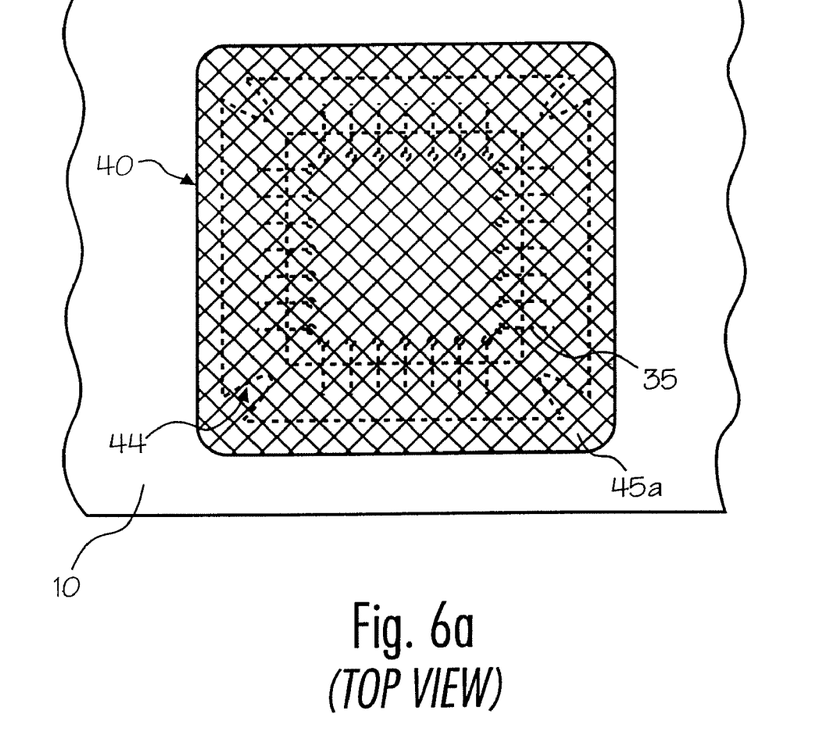
FIGS. 6a and 6b illustrate a shock and tamper resistant microelectronic device produced by the exemplary method shown in FIG. 5.
Figure 6B:
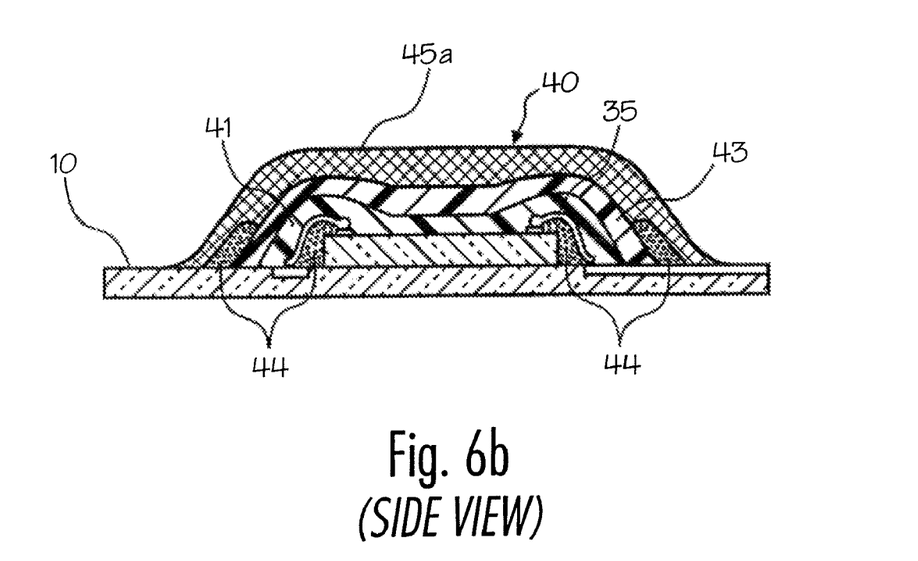

An example of such a device is shown in FIGS. 6A and 6B. As shown, filler material 44 fills small areas and gaps in and around the device while shell coating 45 provides a surface resistant to moisture with excellent handling characteristics.

Figure 7A:
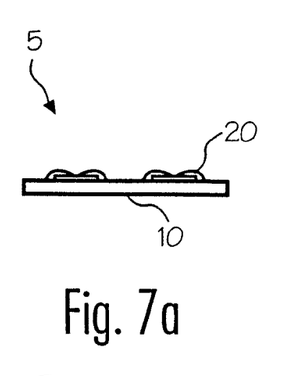
FIGS. 7a-7j illustrate a shock and tamper resistant microelectronic device after each process of the exemplary method shown in FIG. 5.
Figure 7B:
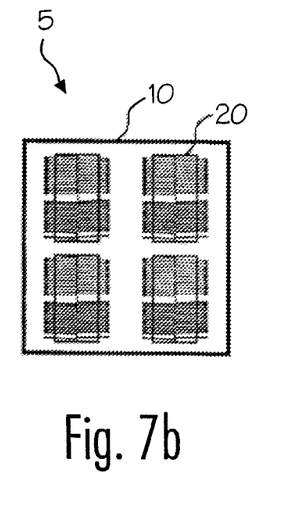
Figure 7C:
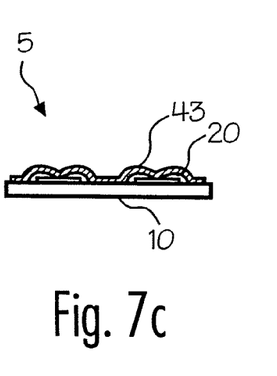
Figure 7D:
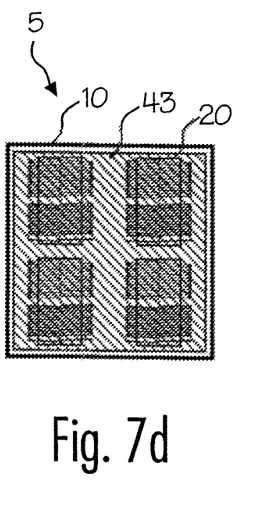
Figure 7E:
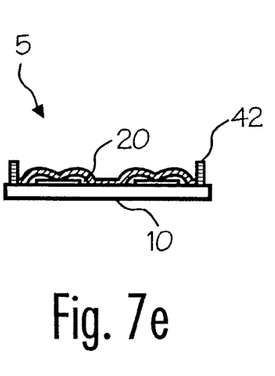
Figure 7F:
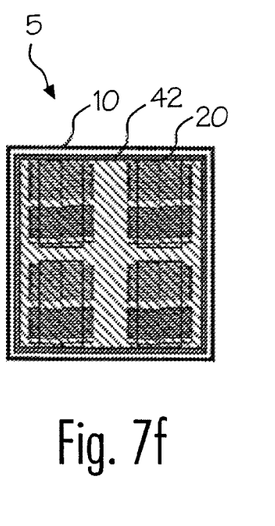
Figure 7G:
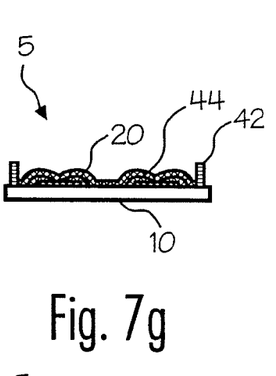
Figure 7H:
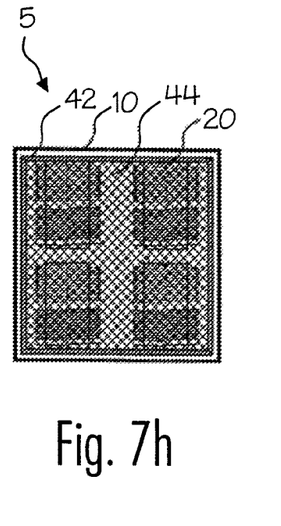
Figure 7I:
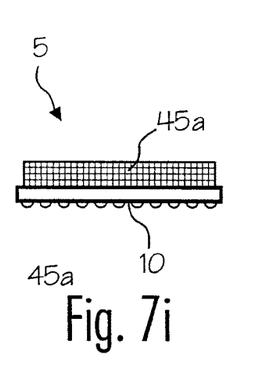
Figure 7J:
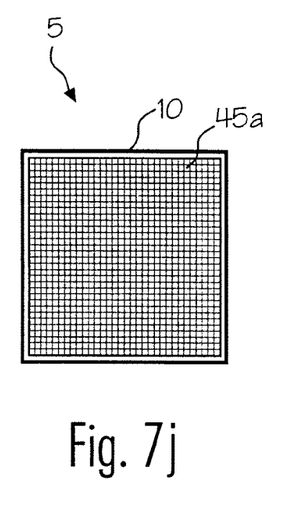

Turning to FIGS. 7a-7j, top and cross-sectioned side views of a microelectronic device are illustrated during the various processing states of the preferred method discussed with respect to FIG. 5. Specifically, FIGS. 7a and 7b illustrate respective side and top views of device 5 including four circuit die 20 exposed and electrically bonded to substrate 10. FIGS. 7c and 7d illustrate respective side and top views of device 5 after one or more layers of tamper resistant coating 43 have been applied. FIGS. 7e and 7f illustrate the same circuit 5 with barrier 42 erected from damming material for bare chip encapsulation. FIGS. 7g and 7h illustrate respective side and top views of device 5 after filler material 44 has been applied and air has been removed. FIGS. 7i and 7j illustrate device 5 after shell coating 45a has been applied.

It should be recognized that the invention might be equally applied using molded encapsulation methods as opposed to the liquid encapsulation processes described above. Moreover, the present invention may also be used in preparation of microelectronic devices in ceramic packages as well as on laminate substrates. Consequently, the specific materials, steps and equipment described above would be selected/modified for utilizing the present invention in molded encapsulation techniques or for application with ceramic packages.

Unless contrary to physical possibility, the inventors envision the methods, devices and systems described herein: (i) may be performed or assembled in any sequence and/or combination; and (ii) the components of respective embodiments combined in any manner.

Although there have been described preferred embodiments of this novel invention, many variations and modifications are possible and the embodiments described herein are not limited by the specific disclosure above, but rather should be limited only by the scope of the appended claims.

What is claimed is:

1. A method for producing a circuit comprising at least one die electrically connected to a substrate, the method comprising:
    forming a tamper-resistant coating over the circuit for preventing circuit inspection and circuit tampering by spraying the circuit with a molten material;
    forming a first protective barrier around the circuit by applying a first encapsulant material after the forming of the tamper-resistant coating;
    removing air pockets from the first encapsulant material; and
    electrically connecting the at least one die to the substrate before forming the first protective barrier.

2. The method of claim 1 wherein before forming the tamper-resistant coating, the method further comprises:
    applying a primer material over the circuit, the primer material for promoting adhesion of, and protection from, the molten material of the tamper-resistant coating.

3. The method of claim 2 wherein removing air pockets from the first encapsulant material comprises at least one of (i) vacuum baking the first protective barrier formed around the circuit and (ii) applying the first encapsulant material in a vacuum.

4. The method of claim 2 wherein prior to applying the primer material to the circuit, the method further comprises masking surfaces of the circuit where primer material and tamper-resistant coating is not desired.

5. The method of claim 1 wherein after removing air pockets from the first encapsulant material, the process further comprises forming a second protective barrier around the circuit by applying a second encapsulant material.

6. The method of claim 5 wherein the second encapsulant material, when in a liquid state, has a higher viscosity than a liquid state of the first encapsulant material.

7. The method of claim 1 wherein the substrate comprises a laminate substrate.

8. The method of claim 5 wherein removing air pockets from the first encapsulant material comprises vacuum baking the first protective barrier formed around circuit.

9. The method of claim 5 wherein removing air pockets from the first encapsulant material comprises applying the first encapsulant material in an environment having a lower pressure than atmospheric pressure.

10. The method of claim 5 wherein removing air pockets from the first encapsulant material comprises applying the first encapsulant material by injecting the first encapsulant under a pressure.

11. A method for producing a shock and tamper resistant coating for a microelectronic device electrically connected to a substrate, the method comprising:
- applying a thermal protection coating over the microelectronic device;
- applying a tamper-resistant coating over the thermal protection coating;
- applying a first encapsulation layer around the tamper-resistant coated device;
- inducing the first encapsulation layer into gaps in the tamper-resistant coated device; and
- electrically connecting the microelectronic device to the substrate before applying the first encapsulation layer.

12. The method of claim 11 wherein, after inducing the first encapsulation layer into gaps, the method further comprises:
- applying a second encapsulation layer around the first encapsulation layer, the second encapsulation layer for providing a handling surface and moisture resistance for the microelectronic device.

13. The method of claim 12 wherein inducing the first encapsulation layer into gaps comprises, applying the first encapsulation layer in a vacuum environment.

14. The method of claim 12 wherein inducing the first encapsulation layer into gaps comprises, applying the first encapsulation layer using a pressurized injection process.

15. The method of claim 12 wherein inducing the first encapsulation layer into gaps comprises, degassing the first encapsulation layer in a raised temperature vacuum environment.

16. The method of claim 15 wherein the raised temperature vacuum environment comprises an environment of approximately 90° C. and 24 in. Hg.

17. The method of claim 12 wherein the first encapsulation layer is applied using a first liquid encapsulant having a first viscosity and wherein the second encapsulation layer is applied using a second liquid encapsulant having a second viscosity higher than the first viscosity.

18. The method of claim 12 wherein the first and second encapsulation layers are applied using a molded encapsulation process.

* * * * *